United States Patent [19]

Van Dyk et al.

[11] 3,766,350

[45] Oct. 16, 1973

[54] MOUNTING OF A LIGHT EMITTING DEVICE ON A CIRCUIT

[75] Inventors: Robert Maarten Van Dyk, Dunrobin; Peter Francis Maheux, Kanata, Ontario, both of Canada

[73] Assignee: Northern Electric Company Limited, Montreal, Quebec, Canada

[22] Filed: Mar. 15, 1972

[21] Appl. No.: 234,845

[52] U.S. Cl. ...... 200/167 A, 200/159 R, 340/365 R

[51] Int. Cl. ...... H01h 9/16

[58] Field of Search ...... 200/159 R, 159 B, 200/83 N, 167 A; 317/101 B, 101 C, 101 F; 179/90 K; 340/365 A

[56] References Cited

UNITED STATES PATENTS 3,627,935 12/1971 Spievak ...... 200/5 R 3,594,684 7/1971 Miller ...... 200/159 B X 3,290,439 12/1966 Willcox ...... 179/90 K X 3,240,885 3/1966 Grunfelder ...... 340/365 A X 3,486,145 12/1969 Paige ...... 200/159 R X

*Primary Examiner*—David Smith, Jr.
*Assistant Examiner*—William J. Smith
*Attorney*—Sidney T. Jelly

[57] ABSTRACT

An electrical component is mounted on a part of a flexible circuit with the part of the circuit capable of limited movement relative to the remainder of the circuit. Movement of the component moves the part of the circuit and causes a change of state or condition of the component. A typical example is a lighted button which, when touched, moves the attached part of a circuit. This movement actuates an electrical contact, directly or indirectly, to light the lamp in the button.

5 Claims, 3 Drawing Figures

MOUNTING OF A LIGHT EMITTING DEVICE ON A CIRCUIT

This invention relates to the mounting of a component on a flexible circuit and in particular to the mounting of a component so that it is possible to make small movements of the component relative to the remainder of the circuit.

The use of printed circuits and particular flexible printed circuits is widely spread, being used in many varying forms depending upon the particular application. Components are mounted upon or are formed as part of such circuits but switching and other actions used to energize, de-energize, actuate or in ways modify the condition of the component are still carried out by more conventional means such as mechanical contacts which move through relatively large distances. Such means are usually removed from the flexible circuit, being connected thereto by leads. For example they may be switches, pushbuttons and the like.

The present invention provides for an arrangement in which a component is mounted on one part of a flexible circuit and is capable of limited movement relative to another part of the circuit, the movement creating or resulting in a change of state or condition of the component. In a particular example the flexible circuit is partially separated from the remainder of the circuit at the position where the component is mounted.

The invention is particularly, though not exclusively, applicable to pushbutton key sets for telephone systems. The conventional pushbutton can be replaced by a button incorporating light emitting diodes mounted directly on part of a flexible printed circuit. Pressure on the button moves the part of the circuit relative to the remainder, this movement being very small. As a result of the movement the diodes are energized either directly or indirectly. Other applications are those where the state or condition of a component is to be modified, for example capacitance, impedance and other characteristics, by a slight movement of a component.

The invention will be readily understood by the following description of an embodiment, by way of example, in conjunction with the accompanying drawings, in which.

Figure 1:
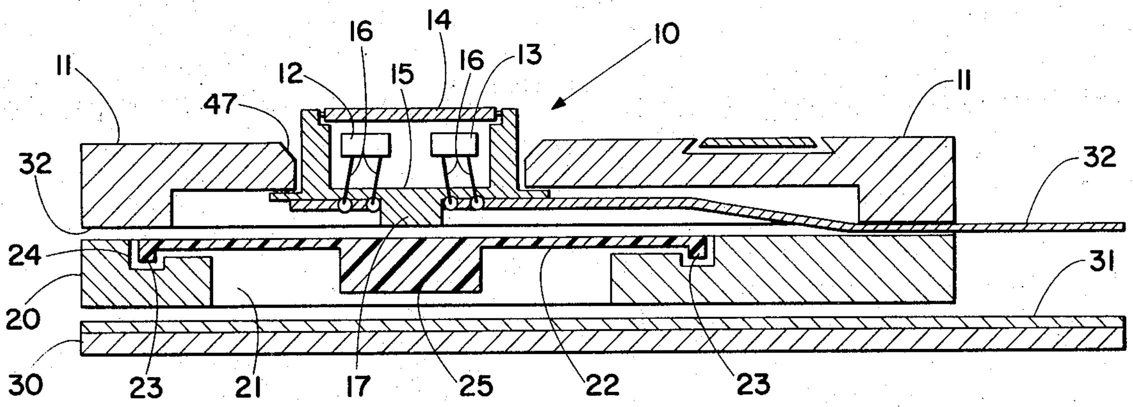
FIG. 1 is a diagrammatic cross-section through a pushbutton key set of a telephone.

As illustrated in FIG. 1, a pushbutton 10 is mounted in a button frame 11. The button is hollow and has two light emitting diodes 12 and 13 mounted therein. The top of the button is closed by a light filter 14. The base 15 of the button is solid with the main body of the button, the leads 16 of the diodes 12 and 13, passing through the base 15. At the center of the base 15 is a downwardly projecting boss 17.

The button frame 11 is mounted on a base 20, an opening 21 formed in the base 20 beneath the button 10. Across the opening 21 is positioned a diaphragm 22 of resilient conducting material, such as conducting rubber. The diaphragm 22 is gripped between the button frame 11 and base 20, and positioned by a rim 23 sitting in a groove 24 in the base 20. At the center of the diaphragm 22 is a downwardly projecting boss 25.

The base 30 is in turn mounted on a circuit board 30 having a printed circuit 31 thereon. Positioned between the button frame 11 and base 20 is a flexible circuit 32. Flexible circuit 32 is attached, as by bonding, to the base 15 of the button 10, the boss 17 projecting through the circuit 32.

Figure 2:
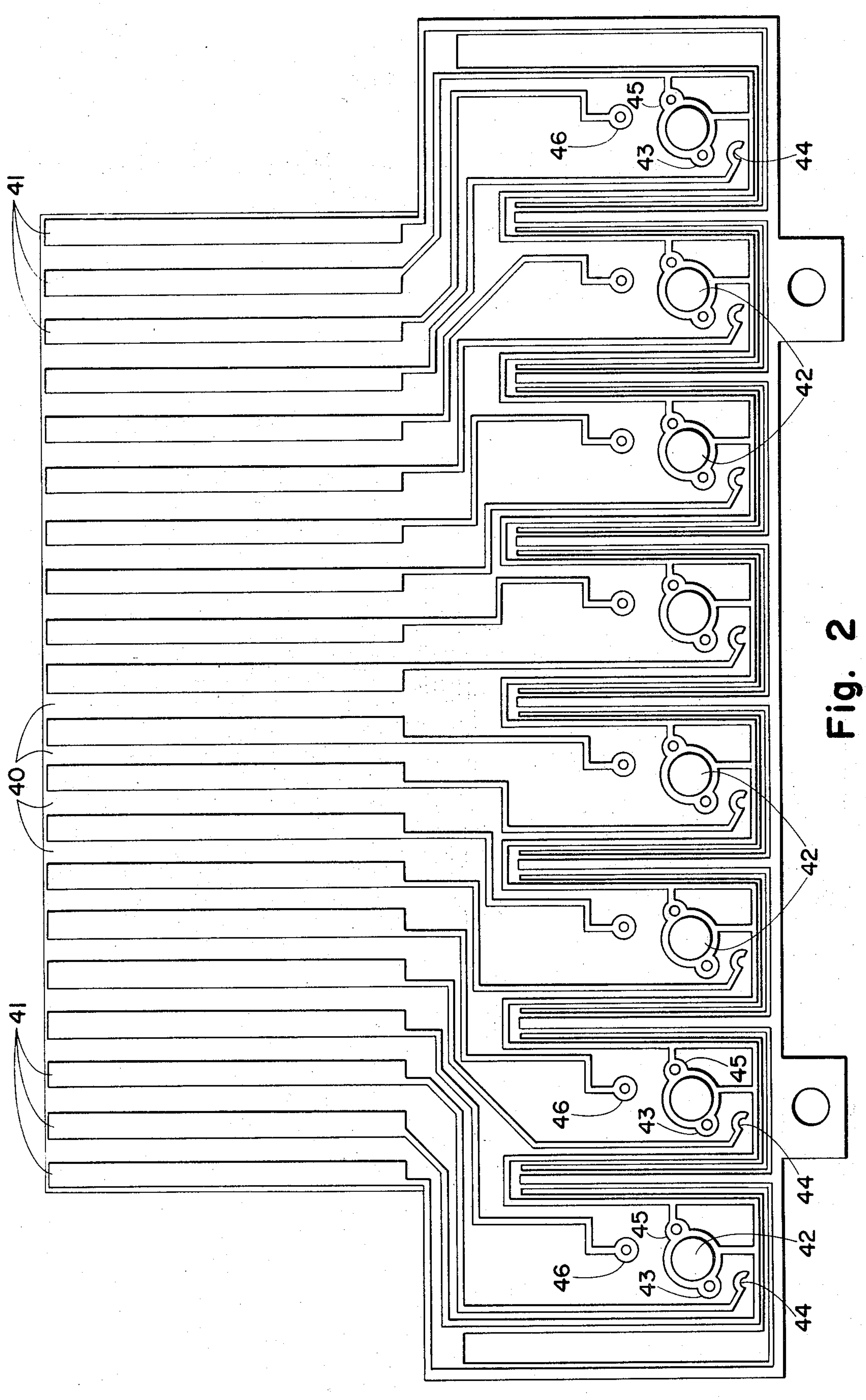
FIG. 2 is a plan view of a flexible circuit for a key set, as in FIG. 1, showing mounting positions of pushbuttons.

The flexible circuit 32 is seen in more detail in FIG. 2. The circuit is printed or otherwise formed on a support film of plastic material 40. The circuit, indicated generally at 41, is of a conducting material, for example copper. In the circuit shown provision is made for light buttons each having two light emitting diodes, as in FIG. 1. At 42 are holes cut through the circuit for the bosses 17 (FIG. 1). At 43, 44, 45 and 46 are the terminations or connecting points for the diodes 12 and 13 (FIG. 1). Terminations 43 and 44 are for the diode 12 and terminations 45 and 46 for the diodes 13. It will be seen that a conductor 47 extends right through the circuit forming a common conductor for all of the terminations 43 and 45. Separate individual conductors are provided for terminations 44 and 46. The portions of the flexible circuit immediately below and attached to the bases of the buttons are partially detached from the rest of the flexible circuit by thin slits 48 cut in the flexible circuit support film 40. The slits 48 extend on three sides of the rectangle beneath each button and, as seen in FIG. 1, when the complete unit of buttons 10, button frame 11, base 20, flexible circuit 32 and circuit board 30 is assembled, the parts of the flexible circuit attached to the button bases are slightly out of planar alignment with the remainder of the flexible circuit.

Figure 3:
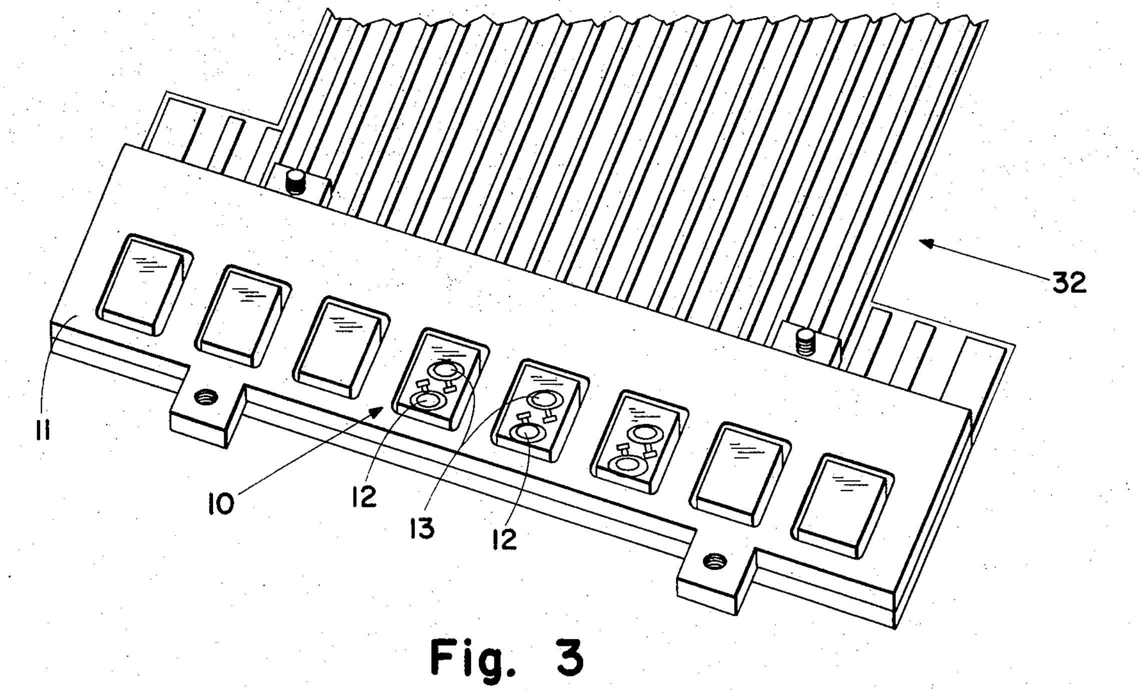
FIG. 3 is a view of the pushbutton frames mounted on the flexible circuit with the pushbuttons in position.

FIG. 3 shows an assembled pushbutton key unit. The buttons can have coloured filters, 14 of FIG. 1, and in FIG. 3 three of these have been removed to show the diodes 12 and 13 in position in the buttons 10. The assembly is neat and compact, and is efficient. The filters can be of a contrast enhancing type, for example such as a red circular polarizer. A transparent button edge can be provided, surrounding the filter, to provide edge lighting when the diodes in the button are energized. The button frame 11 can also have a chamfered edge around the button to enhance the button edge lighting, as shown at 47 in FIG. 1.

When assembled, the diaphragm 22 is in an equilibrium position with a small clearance between the diaphragm and the boss 17 on the base of the button. There is also a small clearance between the circuit 31 on the circuit board 30 and the boss 25 on the diaphragm 22. Slight pressure on the button 10 causes the boss 17 to push the diaphragm 27 down at its center, in turn moving the boss 25 into contact with the circuit 31 forming an electrical connection between two or more conductors. Depending upon the arrangement of the circuit on the circuit board 30, the flexible circuit 32 and the associated equipment, different results can be obtained. Thus pressure on a button can result in the energization of either or both of the diodes or of de-energization of the diodes. For example, energization of one of the diodes may occur by actuation of a remote action to indicate that a telephone call has been routed to the particular extension concerned. Pressing of the button 10 will energize the second diode to indicate connection and also to make the connection. Alternatively, the energization of one diode in any one or more of the buttons will indicate that certain lines are engaged. The button having two diodes energized indicates which line the extension is connected to. The movement of the button is very small for example approximately 0.020 ins.

While described as energizing a diode it can be that other components are used. Thus forms of light sources other than light emitting diodes can be used. Similarly it may be that the component itself is acted on directly instead of being in a button. Also, a component having a characteristic or function other than the emission of light may be so mounted. Thus movement of a component may result in a change of, for example, capacitance, resistance or any other electrical state or condition. A component may be mounted at any position in a flexible circuit, relative movement being provided by selective slitting of the circuit support film at the location of the component. Such flexible circuit may form part of a larger circuit not all of which need be flexible.

It is the mounting of the component on part of the circuit which is free to move relative to the remainder of the circuit which provides for the versatility of operation. Only small limited movements are required. Very simple mounting procedures can be used to give cheap and efficient devices.

What is claimed is:

1. A mounting for a light emitting device, comprising a flexible circuit, a part of the flexible circuit detached from the remainder of the flexible circuit for part of its periphery; a light emitting device attached to said part of the flexible circuit; and a further circuit in juxtaposition to said flexible circuit, whereby said part of the flexible circuit is capable of limited movement relative to the remainder of the flexible circuit towards and away from said further circuit, the limited movement resulting in a change of condition of the light emitting device.

2. A component mounting as claimed in claim 1, the mounting comprising a pushbutton key assembly for a telephone set, the light emitting device mounted in a pushbutton, said part of the flexible circuit attached to the button base and the light emitting device connected to the part of the flexible circuit through the button base.

3. A component mounting as claimed in claim 2, the pushbutton key assembly comprising a plurality of pushbuttons, each button attached to a separate part of the flexible circuit, each part partially detached from the remainder of the flexible circuit and a light emitting device in each pushbutton and connected to the related part of the flexible circuit; and a frame mounting said pushbuttons.

4. A component mounting as claimed in claim 3 further comprising a base, the frame mounted on said base, said further circuit mounted on said base.

5. A component mounting as claimed in claim 4, said base having an aperture in axial alignment with each pushbutton, the further circuit mounted on the base on the surface remote from said frame; and a resilient conductive member extending over each aperture, whereby pressure on a button pushes a conductive member in the related aperture into contact with said further circuit for energization of the light emitting device.

* * * * *